INVENTOR.
DAVID L. LAFUZE
BY Lawrence G. Norris
ATTORNEY

INVENTOR.
DAVID L. LAFUZE
BY Lawrence G. Norris
ATTORNEY 3,139,576
CASCADED MAGNETIC AMPLIFIER SYSTEM

David L. Lafuze, Cincinnati, Ohio, assignor to General Electric Company, a corporation of New York Filed Oct. 31, 1960, Ser. No. 66,089
5 Claims. (Cl. 323—85)

Figure 1:
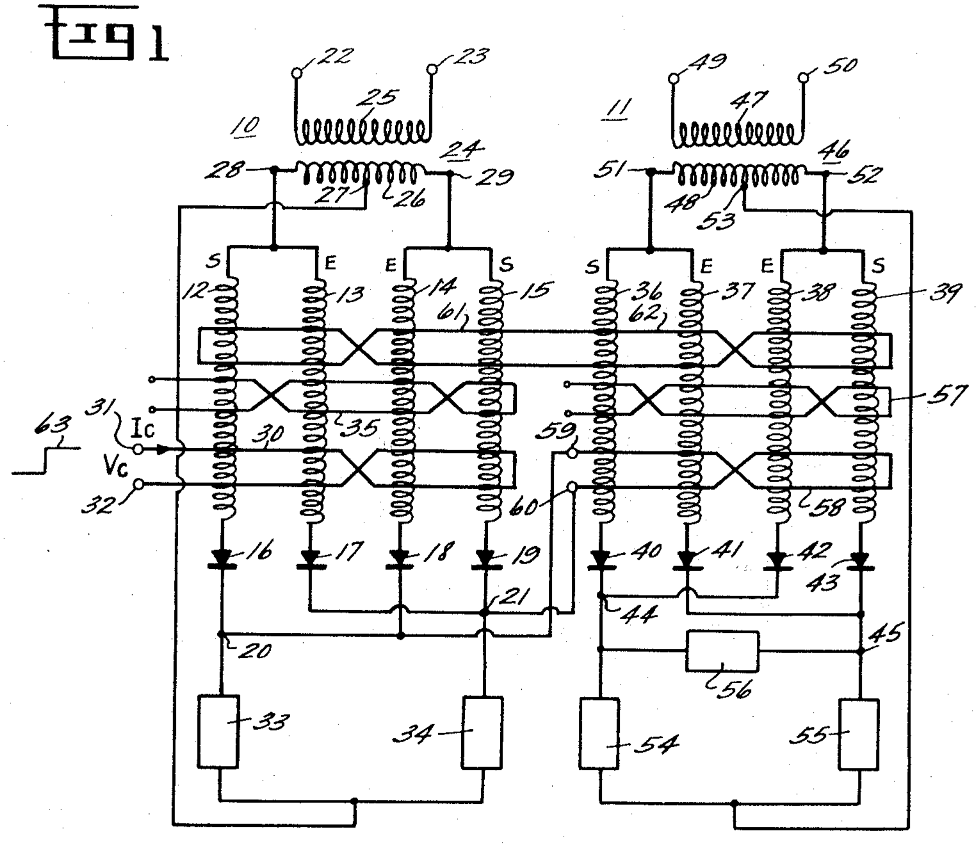

My invention relates to magnetic amplifiers and in particular to magnetic amplifier systems in which two or more amplifier stages are connected in series or cascade with each other.

In discussing the problem to which my invention is directed I will use as an example two magnetic amplifier stages connected in cascade, although it will be appreciated from the discussion that the same considerations apply to any number of cascaded magnetic amplifier stages. First of all, it will be appreciated by those skilled in the art that the typical single stage magnetic amplifier normally has associated with it as one of its inherent design characteristics a primary time constant which specifies the control signal frequency above which the gain of the amplifier begins to fall off. In other words, for input control frequencies below the frequency specified by the time constant, the gain of the amplifier remains relatively constant whereas for frequencies above the specified frequency the gain of the amplifier begins to fall off inversely with incremental increases in the control signal frequency.

Now when two magnetic amplifier stages are connected in series or cascade with each other, the overall amplifier system formed by the two stages has associated with it two such time constants. Each of these time constants determines a frequency above which the gain of the amplifier system begins to fall off with increasing frequency. However, for frequencies in excess of both of the frequencies determined by the two time constants the gain of the system falls off approximately inversely as the square of incremental increases in the frequency of the control signal. For frequencies above the frequency of the first time constant but below that specified by the second time constant the gain decreases approximately directly inversely to incremental increases in the control frequency.

Now when a cascaded amplifier system is used as part of a control system or other system wherein the loop is to be enclosed in a feedback connection, it is desirable from the standpoint of control system stability—that is, the avoidance of sustained oscillations in the loop—that the crossover frequency, or the frequency at which the gain of the amplifier system passes through unity gain, occur at a frequency at which the gain of the system is falling off directly inversely proportional to increasing control frequency rather than falling off inversely as the square of the control frequency or some higher power of the control frequency. While this is not always true, it does happen to be the case in many applications wherein cascaded magnetic amplifiers are utilized. The particular reasons for this will be discussed in greater detail later on in the specification. It will be observed, however, that given this requirement, the crossover frequency of the cascade system, that is the frequency at which unity gain appears, must occur at a frequency which is intermediate the two frequencies determined by the time constants of the two amplifiers in the cascade. In other words, if the crossover frequency were to be placed at a frequency higher than the greater of the two frequencies determined by the amplifier time constants, the system would tend to be unstable when used in a feedback loop because the crossover frequency would then occur at a frequency where the gain of the system is decreasing inversely as the square of increasing control frequency.

It will be observed therefore that this requirement limits the maximum permissible crossover frequency to one which is less than the higher of the two frequencies determined by the amplifier time constants. Now it is desirable in some systems for transient response purposes and for various other reasons to increase the band width of the amplifier system response—that is to increase the frequency at which the gain of the system is finally attenuated to the unity level. In a system of the kind that I have just described, however, it is not feasible to do this without encountering loop stability problems for the reasons I have already explained.

It will also be appreciated that the foregoing stability requirement imposed on a cascaded magnetic amplifier system limits the D.-C. or low frequency gain which can be provided by the system. In other words, if the gain of the cascaded system must be attenuated to the unity level at some frequency intermediate the two frequencies established by the amplifier time constants and the system gain in the vicinity of the crossover frequency is approximately inversely proportional to the incremental frequency changes, then the D.-C. gain of the system is limited to a level which will produce unity gain at the specified crossover frequency. If it were permissible to allow the gain of the system to remain higher than the unity gain level at what would otherwise be the crossover frequency of the system, or in other words if a significantly higher crossover frequency could be selected, then the D.-C. gain or the frequency gain of the cascade system could be made significantly higher. A high D.-C. gain is, of course, desirable from the standpoint of minimizing steady state errors in the system and also from the standpoint of compensating for system non-linearities such as motor breakaway torques, backlash effects, and the like.

In view of the foregoing, it is accordingly one object of my invention to provide an improved cascaded magnetic amplifier system in which the above mentioned effects of the individual amplifier time constants are compensated for in such a manner that a significantly higher crossover frequency may be selected without adversely affecting the stability of the system.

It is another object of my invention to provide an improved cascaded magnetic amplifier system in which the amplifier stages are interconnected in such a manner as to compensate for the effects of one of the amplifier time constants (in the case of a two-stage cascade) at the higher frequencies and thereby allow a higher crossover frequency to be selected than would otherwise be the case.

Figure 2:
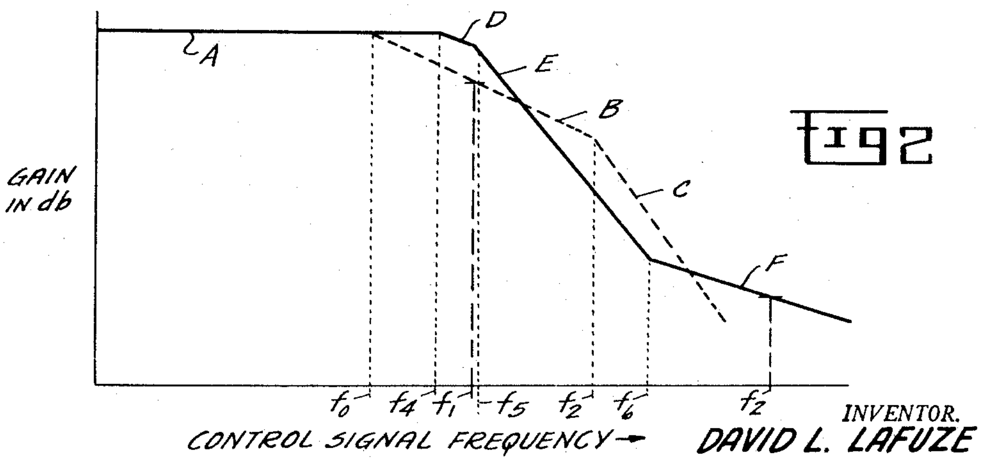
Figure 3:
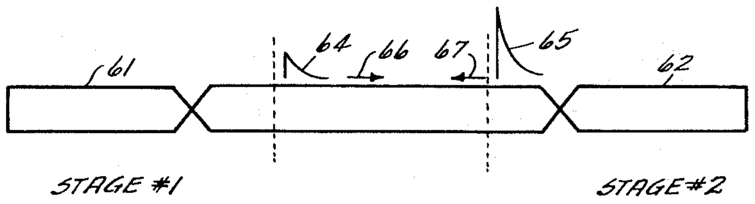
Figure 4:
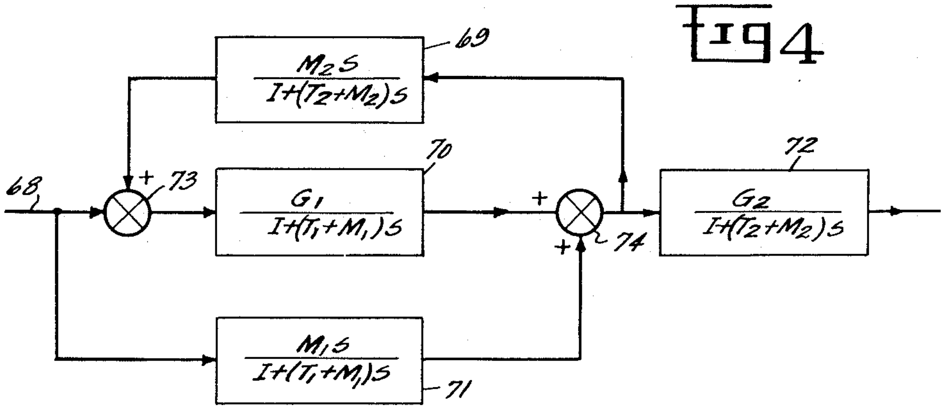

I accomplish these and other objects of my invention in one embodiment thereof wherein two magnetic amplifiers are employed in cascade by providing an additional winding on each of the amplifier stages and then interconnecting these windings between the stages in such a manner that the net time constant of the stage having the larger time constant is decreased while the net time constant of the stage having the smaller time constant is increased. In other words, one of the effects of the interconnecting winding is to move the two frequencies specified by the uncompensated time constants of the two amplifier stages closer together. In this embodiment of my invention the time constant of the first amplifier stage when considered without the effect of the interconnecting winding is larger than the time constant of the second amplifier stage considered without the interconnecting winding. In addition, the interconnecting winding provides an A.-C. coupling between the two amplifier stages which is in parallel with the D.-C. connection which forms the cascade arrangement. At the higher frequencies, then, the A.-C. coupling between the two stages becomes the predominant one and provides a differentiating or lead characteristic which in effect compensates for the time constant of one of the amplifiers, thus allowing a significantly higher crossover frequency to be selected without encountering stability problems. Various other objects and advantages of my invention will become apparent from the following description taken in connection with the accompanying drawings in which:

FIG. 1 is a circuit diagram of a two-stage magnetic amplifier cascade system embodying my invention, and FIG. 2 is a graphical presentation of the gain versus frequency characteristic of the amplifier system of FIG. 1 in which the dotted line shows the frequency response characteristic of a typical prior art magnetic amplifier cascade without the interconnecting winding, and the solid line represents the frequency response characteristic with the interconnecting windings operative, and FIG. 3 is a representation of the interconnecting windings of the system of FIG. 1 showing the wave shapes and the directions of the currents flowing in the interconnecting windings in response to a step input of voltage to the first stage; and FIG. 4 is a transfer function type of block diagram of the system of FIG. 1.

Referring now to FIG. 1, there is shown a two-stage, cascade connected magnetic amplifier system having a first stage 10 and a second stage 11. Each of the two amplifier stages 10 and 11 is a full wave, push pull type of amplifier although it will be apparent from the description of my invention which follows that it is not limited to this particular type of magnetic amplifier.

The first stage 10 is provided with four gate windings 12, 13, 14 and 15, each of which is individually wound on a separate core. Individually associated with the gate windings as shown are output diodes 16, 17, 18 and 19. The gate windings 13 and 15 and their associated diodes 17 and 19 form one full wave side of the push pull amplifier while the gate windings 12 and 14 and their associated diodes 16 and 18 form the other full wave side of the push pull stage. The diodes 16 and 18 are electrically connected to one of the output terminals 20 and the diodes 17 and 19 are connected to the other output terminal 21.

The A.-C. power input to the first stage amplifier 10 is supplied to a pair of input terminals 22 and 23 of a transformer 24 having primary and secondary windings 25 and 26 respectively, the secondary winding 26 having a center tap at 27. The secondary winding 26 of the transformer 24 is provided with output terminals 28 and 29 which are connected respectively to pairs 12–13 and 14–15 of the gate windings. The first stage 10 is provided with a control winding 30 which is coupled magnetically to the four cores on which the gate windings are wound and to which the input or control signal is introduced at a pair of input terminals 31 and 32. The basic circuit of the amplifier stage 10 is completed by a pair of output resistors 33 and 34 which are connected respectively to the output terminals 20 and 21 and back to the center tap 27 of the transformer 24 as shown. The amplifier stage 10 is also provided with a suitable bias winding 35 which may be energized either from an external source or by means of some sort of self-biasing arrangement.

The second stage 11 is similar to the first stage 10 in respect to the elements described thus far. The second stage includes gate windings 36, 37, 38 and 39 connected respectively to output diodes 40, 41, 42 and 43, the diodes 40 and 42 being connected to one of the output terminals 44 and the diodes 41 and 43 being connected to the other output terminal 45.

A.-C. power is supplied to the second stage 11 through a transformer 46 having primary and secondary windings 47 and 48 respectively. The primary winding 47 is provided with power input terminals 49 and 50 and the secondary winding 48 is provided with output terminals 51 and 52 and a center tap terminal 53. Connected across the output terminals 44 and 45 are output resistors 54 and 55 which are connected as shown back to the center tap 53. Also connected across the output terminals 44 and 45 of the second stage 11 is a load device 56 which represents the element to which the power output signal of the cascaded system is to be supplied. The second stage 11 is also provided with a bias winding 57 which, as in the case of the first stage, may be excited either from an external source or by means of an internal self-biasing arrangement.

The input signal to the second stage is applied to a control winding 58 at a pair of input terminals 59 and 60. The output signal of the first stage 10, which appears at the output terminals 20 and 21 is connected to the input terminals 59 and 60 of the second stage 11 as shown to form a typical cascade arrangement. The magnetic amplifier system set forth thus far in connection with the detailed description of FIG. 1 is a conventional cascade arrangement, the operation of which is well known to those skilled in the art, and it will therefore not be further described.

In addition to the D.-C. connection between the two stages 10 and 11, which is formed by connecting the output terminals 20 and 21 of the first stage 10 to the input terminals 59 and 60 of the second stage 11, I also provide an additional winding 61 on the first stage 10 together with an additional winding 62 on the second stage 11 and I interconnect these two windings 61 and 62 as shown to provide an additional coupling between the two amplifier stages. I will now describe the effect of the two additional windings 61 and 62 interconnected in the manner shown in FIG. 1.

Referring now to FIG. 2, wherein I have depicted the total gain of the cascaded system as a function of the input or control signal frequency plotted on a logarithmic scale, it will be recalled that, as I have stated above, the typical characteristic of a two-stage cascade amplifier would normally have associated with it two time constants, each of which specifies a frequency above which an order of attenuation in amplifier gain is encountered. A typical characteristic of this kind is shown by the dotted line in FIG. 2 including the portion A of the solid line which extends to the left of the dotted line. It will be observed that in the case of the system represented by the dotted line the gain of the amplifier system remains substantially constant out to a control frequency $f_0$, which is the control signal frequency at which the larger of the two amplifier time constants begins to take effect. At control signal frequencies above $f_0$ the amplifier system gain falls off at a rate represented by the dotted line portion B at approximately 20 db attenuation for each decade of increasing control frequency.

At the control signal frequency $f_2$ the smaller of the two amplifier time constants begins to take effect and for control signal frequencies in excess of $f_2$ the amplifier gain falls off at a more rapid rate as illustrated by the portion C of the dotted line, the slope of which is 40 db attenuation for each decade of increasing control frequency. Because of the phase shift between the output and input signals which is associated with the attenuation in the amplifier gain, it is desirable from the standpoint of control loop stability to attenuate the overall gain of the amplifier system to less than the unity level at a frequency less than the frequency $f_2$ where the phase shift begins to approach 180°. In other words, the crossover frequency, or the frequency at which the gain of the system is attenuated to the unity level, would normally be selected, in the case of an amplifier having the characteristics represented by the dotted line, at some frequency $f_1$ intermediate the two frequencies $f_0$ and $f_2$. It will be observed that this requirement imposes two restrictions on the design. First of all, it limits the band width of the amplifier response because the amplifier gain cannot be allowed to remain above the unity level at frequencies beyond $f_1$, and secondly it limits the maximum D.-C. gain which can be selected because the D.-C. gain which is determined by the portion A of the frequency response characteristic is limited to a specified number of db above the unity gain level as determined by the difference in the frequencies $f_0$ and $f_1$.

With the arrangement of my invention, however, the crossover frequency can be selected to occur at a much higher frequency, say at a frequency in the vicinity of $f_3$, thereby allowing not only the band width of the amplifier to be increased to improve the transient response, but also allowing a much higher D.-C. gain to be selected. The frequency response characteristic of an amplifier embodying my invention is shown in the solid line of FIG. 2 and it will be observed that the number of db which the D.-C. gain line A is above the unity gain that is shown at $f_3$ can be much greater than that which can be achieved in a system of the kind shown in the dotted lines.

Referring now to FIGS. 1 and 3, I will explain the manner in which this effect is achieved. For purposes of explanation I will apply to the input terminals 31 and 32 of the first stage a step input of control voltage *Vc* of the form represented at 63. Through the transformer coupling between the control winding 30 and the winding 61 of the first stage the step voltage input to the winding 30 will produce in the winding 61 a pulse of current of the general shape 64 as shown in FIG. 3. At the same time the first stage 10 will produce an output signal in response to the step input which will be applied to the input terminals 59 and 60 of the second stage amplifier 11. This signal in turn will through the same kind of transformer action produce a current pulse in the winding 62 on the second stage.

The shape of the second current pulse is shown at 65 in FIG. 3. It will be observed that the current pulse 65 is substantially larger in magnitude than the current pulse 64 by reason of the fact that the step input 63 is amplified by the first stage amplifier 10 before it is applied to the input winding 58 of the second stage. The direction of the current pulse 64, which is indicated schematically by the arrow 66, is in a direction which opposes the action of the input signal to the first stage, or in other words is in a direction which tends to slow down the response of the first stage. Similarly, the direction of the current pulse 65, which is indicated by the arrow 67, is in a direction which tends to slow down the response of the second stage 11.

Now it will be observed that by reason of the fact that the current pulse 65 is larger than the current pulse 64, the net current flow in the windings 61 and 62 will be the direction of the arrow 67. In other words, the direction of the current flow in the winding 61 in the first stage amplifier 10 will be such as to speed up the response of that stage whereas the direction of the net current flow in the winding 62 in the second stage 11 will be such as to slow down the response of that stage. The result is that the net effective time constant of the first stage amplifier 10 will be decreased whereas the net effective time constant of the second stage amplifier 11 will be increased, each with respect to the time constant which would normally have been associated with that amplifier stage in the absence of the interconnected windings 61 and 62.

In the particular arrangement which I have chosen for presentation herein, the first stage amplifier 10 has the larger time constant, which is represented by the frequency $f_0$, and the second stage amplifier 11 has the smaller time constant, represented by the frequency $f_2$. Since the time constant of the first stage amplifier is decreased by reason of the effect which I have discussed above the frequency which it takes effect will be moved out to a higher frequency, say the frequency $f_4$ as shown in FIG. 2. At the same time, since the time constant of the second stage 11 is increased the frequency at which it takes effect will be reduced from the frequency $f_2$ down to some lower frequency, say $f_5$.

Thus it will be observed that in the arrangement of FIG. 1 with the interconnected windings operative the gain of the amplifier system remains substantially constant out to the first break frequency $f_4$, that over the portion of the response curve D the gain is attenuated at the rate of 20 db per decade, and that over the portion of the curve E immediately beyond the frequency $f_5$ the gain is attenuated at the rate of 40 db per decade. Now it is to be noted here that as the frequency of the input signal is increased beyond the frequency $f_4$ the magnitude of the D.-C. applied to the second stage is rapidly attenuated with the result that the output signal 65 of the winding 62, which is derived through the D.-C. connected path between the amplifiers, is also rapidly attenuated. As this effect continues with increasing frequency the input signal to the first stage which is coupled into the winding 61, in other words the signal represented by the pulse 64, begins to predominate over the opposing signal 65 which is generated in the winding 62 through the D.-C. connection between the stages. In other words, the interconnected windings 61 and 62 form an A.-C. coupling path between the first and second stages which at the higher frequencies predominates over the D.-C. coupling formed by the connections between the output terminals 20 and 21 of the first stage and the input terminals 59 and 60 of the second stage. This A.-C. coupling between the two amplifier stages provides a differentiating or lead characteristic which at the higher frequencies where it begins to predominate over the D.-C. coupled path compensates for one of the two amplifier time constants.

In the frequency response plot of FIG. 2, this is shown as a lead break occurring at the frequency $f_6$ and the slope of the portion F of the frequency response characteristic is moved upward at that frequency from 40 db per decade to 20 db per decade. The crossover frequency of the amplifier system may now safely be selected to occur at some frequency higher than the frequency $f_6$ say at the frequency represented by $f_3$.

It will be observed that the behavior of the interconnected arrangement of windings 61 and 62 is different over the low frequency band of input control signals than over the high frequency band. At the higher frequencies the interconnected arrangement of windings 61 and 62 acts as an A.-C. coupling between the stages which represents the predominant coupling and which gives the desirable 20 db per decade gain attenuation rate represented by the portion F of the frequency response curve of FIG. 2. At the lower frequencies, however, where the gain of the D.-C. path between the amplifiers has not been substantially attenuated, the interconnected windings act as a feedback path from the second stage amplifier back to the first, the feedback being in a positive direction or, in other words, in a direction to assist the first stage. Since the feedback through this path is positive, care must be taken in selecting the gain of the common winding coupling formed by the windings 61 and 62 to avoid undesirably oscillatory response or sustained oscillations. As the gain of the common winding path formed by windings 61 and 62 is increased the tendency toward oscillatory response and sustained oscillations is also increased. Although I will give a more detailed mathematical analysis later on in the specification, suffice it to say at this point that the response of the system becomes increasingly oscillatory, as the two break frequencies $f_4$ and $f_5$ are moved closer to each other.

I have represented the behavior of the embodiment of FIG. 1 in mathematical terms in the block diagram of FIG. 4. In the block diagram the input to the first stage is represented at 68 and each of the blocks 69, 70, 71 and 72 represents a transfer function for the output over input ratio of the signals coming into and leaving the block. The direction of signal flow is in each case indicated by the arrows and the symbols 73 and 74 represent summing points where the signals coming into those points are added. With respect to the symbols used, S is the Laplace transform, $T_1$ and $T_2$ are the time constants of the first and second stages respectively taken with the windings 61 and 62 open circuited, $M_1$ and $M_2$ are the time constants of the common windings 61 and 62 respectively taken about the first and second stages, and $G_1$ and $G_2$ are the D.-C. gains of the first and second stages respectively.

The positive feedback path formed by the interconnected windings 61 and 62, which predominates at the lower frequencies, is represented by the block 69 and the parallel connected derivative path through the common windings 61 and 62 which predominates at the higher frequencies is represented by the block 71, the basic dynamics of the first stage amplifier being represented by the block 70. The block 72 represents the behavior of the second stage amplifier 11. The overall behavior of the amplifier system in terms of ratio of the output over the input is represented by the following transfer function:

$$\frac{\text{Output current}}{\text{Input current}}=\frac{G_1G_2\left(1+\frac{M_1S}{G_1}\right)}{1+(T_1+T_2+M_1+M_2-G_1M_2)S+(T_1T_2+T_1M_2+T_2M_1)S^2}$$

It will be appreciated by those skilled in the art that sustained oscillations will occur in the above system when the quadratic terms of the denominator of the above transfer function takes on positive real roots. This will occur when the middle term of the denominator expression goes negative or, in other words, when the $G_1$ and $M_2$ term becomes greater than the sum of the remaining terms of the coefficient of S. This means that the gain $G_1$ of the first stage amplifier 10 must be selected in light of the magnitudes of the other parameters involved such that sustained oscillations are not produced. It will also be appreciated by those skilled in the art that the response of the system will take on an oscillatory characteristic when the imaginary roots of the quadratic term becomes significantly large. The quadratic term may be analyzed by those skilled in the art by well known techniques to determine the real and imaginary portions of the roots of the quadratic expression so that the exact nature of the response may be predicted.

It will be observed from the foregoing that I have provided an improved magnetic amplifier cascade arrangement in which adjoining stages in the cascade are coupled together through a derivative path formed by interconnected windings on the two amplifier stages in parallel with the D.-C. coupling which forms the cascade, thereby improving the high frequency response characteristics of the amplifier and allowing the selection of a substantially higher D.-C. gain for applications in which the cascade is to be employed in the feedback loop. While the description which I have presented goes into considerable detail with respect to the particular embodiment of my invention which I have presented herein, I want it understood that this has been done only for the purpose of presenting a full and clear description of my invention and that I do not intend that my invention be limited to the particular arrangement set forth. Accordingly, it will be appreciated by those skilled in the art that various modifications, changes and substitutions in the arrangement which I have presented herein may be made in accordance with the teachings which I have set forth without departing from the true scope and spirit of my invention as I have defined it in the appended claims.

What I claim as new and desire to secure by Letters Patent of the United States is:

1. A magnetic amplifier system comprising first and second magnetic amplifier stages connected in cascade, a first winding magnetically coupled to said first stage, a second winding magnetically coupled to said second stage, and means interconnecting said first and second windings in a direction such that the current responses induced in said windings through the magnetic couplings of said windings to their respective stages oppose each other.

2. In a magnetic amplifier system having first and second magnetic amplifier stages coupled in cascade and in which the basic time constant of said first stage is greater than the basic time constant of said second stage, means for improving the frequency response characteristics of said system comprising a first winding magnetically coupled to said first stage, a second winding magnetically coupled to said second stage, and means interconnecting said first and second windings in a direction to decrease the effective time constant of said first stage and to increase the effective time constant of said second stage.

3. A magnetic amplifier system comprising first and second magnetic amplifier stages connected in cascade, a first winding magnetically coupled to said first stage, a second winding magnetically coupled to said second stage, and means interconnecting said first and second windings to form a signal path between said stages which is in parallel with the signal path which forms the cascade connection between said stages, the direction in which said first and second windings are interconnected being such that a signal induced in said first winding by an input signal to said first stage produces a response in said second winding which adds to the signal applied to said second stage through the parallel signal path which forms the cascade connection.

4. A magnetic amplifier system as set forth in claim 3 in which the gain of the signal path through said amplifier stages formed by said interconnected first and second windings is substantially lower at lower control signal frequencies than the gain through the parallel cascade path but is substantially higher than the gain through said parallel cascade path at the higher control signal frequencies.

5. A magnetic amplifier system as set forth in claim 4 wherein the control signal frequency at which the coupling between said stages formed by said interconnected windings becomes the predominant signal path through said stages is less than the frequency at which the overall gain of said amplifier system is attenuated to the unity gain level.

References Cited in the file of this patent

UNITED STATES PATENTS

| | | |
|---|---|---|
| 2,677,097 | Carleton | Apr. 27, 1954 |
| 2,849,544 | Hert et al. | Aug. 26, 1958 |
| 2,878,327 | McKenney et al. | Mar. 17, 1959 |
| 3,016,493 | Darling | Jan. 9, 1962 |